(12) United States Patent
Kim et al.

(10) Patent No.: US 7,385,653 B2
(45) Date of Patent: Jun. 10, 2008

(54) LED PACKAGE AND BACKLIGHT ASSEMBLY FOR LCD COMPRISING THE SAME

(75) Inventors: Hyung Suk Kim, Suwon (KR); Young Sam Park, Seoul (KR); Hun Joo Hahm, Sungnam (KR); Jung Kyu Park, Suwon (KR); Young June Jeong, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 243 days.

(21) Appl. No.: 10/965,257

(22) Filed: Oct. 15, 2004

(65) Prior Publication Data

US 2005/0264716 A1    Dec. 1, 2005

(30) Foreign Application Priority Data

May 28, 2004    (KR) .................... 10-2004-0038107

(51) Int. Cl.
*G02F 1/13357*    (2006.01)
*F21V 7/04*    (2006.01)

(52) U.S. Cl. .................... 349/61; 348/57; 348/62; 348/64; 348/65; 362/555; 362/612; 257/E33.06

(58) Field of Classification Search ............ 349/57, 349/61, 62, 64, 69, 65; 362/26, 231, 555, 362/601, 612, 613, 800; 257/88, 89, 98, 257/100, E33.059, E33.068, E33.072, E33.074
See application file for complete search history.

(56) References Cited

U.S. PATENT DOCUMENTS 6,598,998 B2    7/2003  West et al.
6,623,142 B1 *  9/2003  Lippmann et al. .......... 362/293
6,679,621 B2 *  1/2004  West et al. .................. 362/327
6,770,498 B2    8/2004  Hsu
6,791,636 B2    9/2004  Paolini et al.
6,976,779 B2 * 12/2005  Ohtsuki et al. ............. 362/608
7,121,709 B2   10/2006  Shinohara et al.
2002/0006040 A1 *  1/2002  Kamada et al. ............. 362/237

(Continued)

FOREIGN PATENT DOCUMENTS

CN    1434335 A    8/2003

(Continued)

OTHER PUBLICATIONS

Chinese Patent Office, Office Action mailed Feb. 2, 2007 and English Translation.

(Continued)

*Primary Examiner*—Toan Ton
*Assistant Examiner*—Tai Duong
(74) *Attorney, Agent, or Firm*—Lowe Hauptman Ham & Berner

(57) ABSTRACT

An LED package used as a light source in a backlight assembly for an LCD includes a substrate, a plurality of light scattering protrusions on the upper surface of the substrate, LEDs separated from each other by designated intervals and arranged in a line on the substrate, and a molding portion, for sealing the upper surface of the substrate including the LEDs, and having an upper surface including two cylindrical surface sections. Each of the cylindrical surface sections has a curvature for totally reflecting light emitted from the LEDs.

20 Claims, 10 Drawing Sheets

U.S. PATENT DOCUMENTS

2002/0085390 A1* 7/2002 Kiyomoto et al. .......... 362/555
2004/0027041 A1* 2/2004 Nishikawa ................. 313/110
2004/0070989 A1 4/2004 Amano et al.

FOREIGN PATENT DOCUMENTS

| JP | 7-13155 U | 1/1995 |
| JP | 10-173870 A | 6/1998 |
| JP | 10-190960 A | 7/1998 |
| JP | 2003-215584 A | 7/2003 |

OTHER PUBLICATIONS

Japanese Patent Office, Office Action mailed, Jun. 26, 2007 and English Translation.

Japanese Patent Office, Office Action mailed Nov. 20, 2007 and English Translation.

* cited by examiner

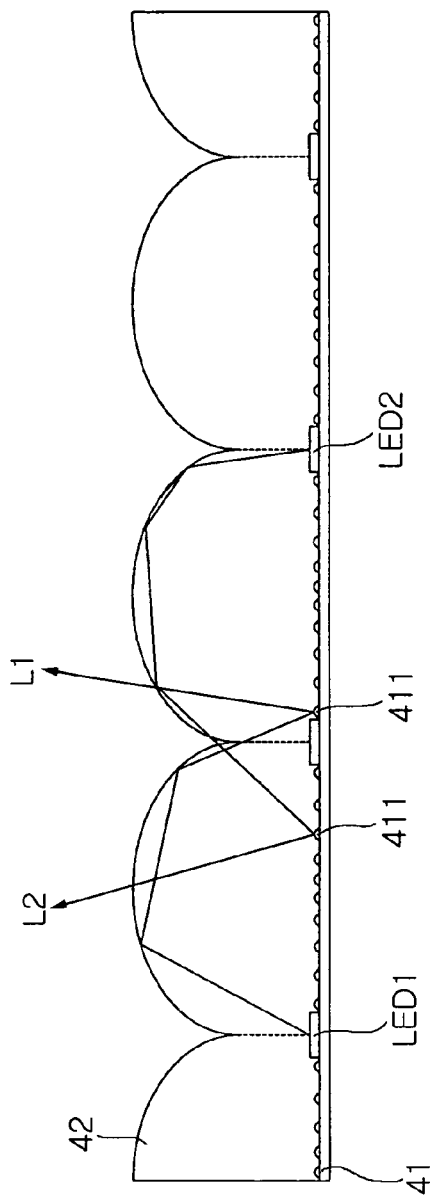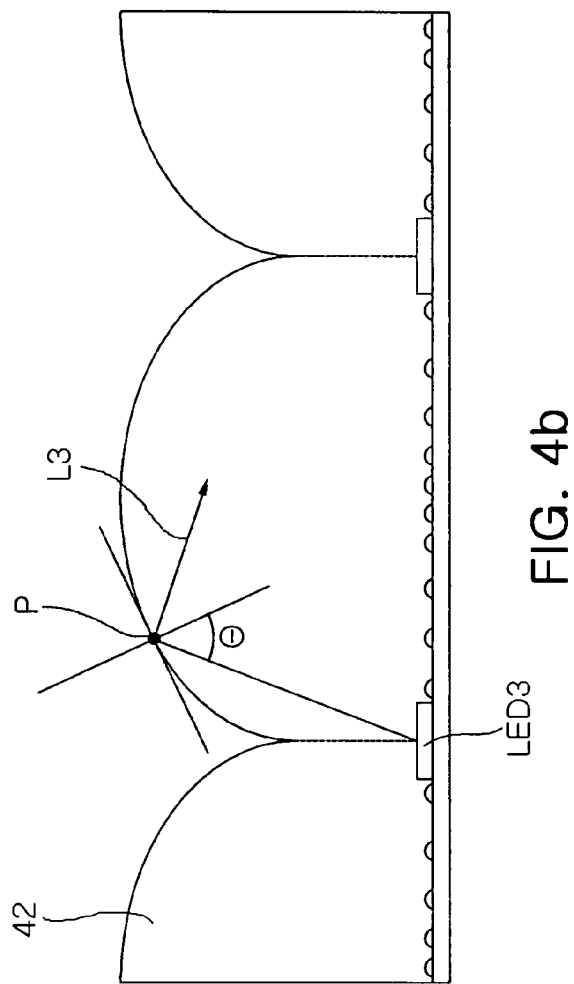
FIG. 4a
FIG. 4b

LED PACKAGE AND BACKLIGHT ASSEMBLY FOR LCD COMPRISING THE SAME

The present application is based on, and claims priority from, Korean Application Number 2004-38107, filed May 28, 2004, the disclosure of which is hereby incorporated by reference herein in the entirety.

BACKGROUND OF THE INVENTION

1. Field of the Invention

The present invention relates to an LED (Light Emitting Diode) package used as a light source for a backlight assembly for an LCD, and a backlight assembly for an LCD comprising the same. More particularly, the present invention relates to an LED package having improved uniformity in luminance and color of light so as to be used as a light source for a backlight assembly, and a backlight assembly for an LCD comprising the same.

2. Description of the Related Art

Generally, LCDs (Liquid Crystal Displays) are passive optical elements, which cannot emit light by itself, and thus displaying images using a backlight assembly attached to a rear surface of an LCD panel. Recent backlight assemblies having various structures have been developed to satisfy slim and lightweight trends for assuring competitiveness of obtained products. Particularly, the LCDs are mainly used in notebook computers and wall-mounted large TVs, thus being required to satisfy the slim and lightweight trends.

A cold cathode fluorescent lamp (hereinafter, referred to as a "CCFL") was used as a conventional light source for generating light for the above backlight assemblies, but is now being replaced with an LED having a high luminance so as to meet the slim and lightweight trends. While the conventional CCFL is a line light source for emitting a nearly uniform white ray to a designated length, the LED is a point light source for emitting a single colored ray. Accordingly, a great deal of research into emitting a white ray having uniform luminance to a designated length or designated dimensions is currently underway.

FIG. 1 is a schematic view of a conventional backlight source for an LCD using an LED. With reference to FIG. 1, the conventional backlight source 10 comprises LED packages 11, which are spaced from each other by designated intervals, and a light guide plate 12 provided with a designated pattern 121 formed thereon and separated from the LED packages 11 by a designated distance (d).

Each of the LED packages 11 of the above conventional backlight source 10 may be one package including RGB (Red, Green and Blue) LEDs, or is one of the above colored LEDs. In order to obtain light having uniform luminance, it is most preferable that a plurality of LED packages be densely arranged. However, the dense arrangement of the LED packages increases costs of the light source and the electric power consumption rate, thus being incapable of being practically employed.

Accordingly, as shown in FIG. 1, the LED packages 11 are spaced from each other by designated intervals. In this case, dark regions (D) are generated due to emitting angle of light emitted from the LED packages 11. In order to reduce the effect of the dark regions (D), the light guide plate 12 must be separated from the LED packages 11 by a sufficient distance (d). The distance (d) between the light guide plate 12 and the LED packages 11 increases the volume of the LCD, thus having a negative effect on the slim and lightweight trends.

The light guide plate 12 is necessary to obtain a uniform white ray by mixing red, green and blue rays generated from the LED packages 11. The light guide plate 12 is provided with the designated pattern 121 formed thereon, thereby extending an optical route in the restricted area and facilitating the mixing of the colored rays.

However, the light guide plate 12, separated from the LED packages 11 by the designated distance (d), increases the size of the LCD, and the intensity of light emitted from the LED packages 11 is concentrated on the central area, thus having a negative effect on the miniaturization of the LCD and deteriorating the uniformity of luminance.

Accordingly, there are required a novel LED package, which is usable as a light source for a backlight assembly of an LCD using an LED, and a light source, using the same, which provides a white ray having uniform luminance to a designated length and designated dimensions.

SUMMARY OF THE INVENTION

The present invention has been made in view of the above problems, and it is an object of the present invention to provide an LED package, used as a light source for a backlight assembly of an LCD, which provides a sufficient optical route so that rays generated from one LED or more are sufficiently mixed to produce a white ray having uniform color and luminance.

It is another object of the present invention to provide a backlight assembly for an LCD comprising the above LED packages.

In accordance with one aspect of the present invention, the above and other objects can be accomplished by the provision of an LED package comprising: a substrate; one LED or more separated from each other by designated intervals and arranged in a line on the substrate; and a molding portion, for sealing the upper surface of the substrate including the LEDs, provided with an upper surface including two cylindrical surface sections, wherein each of the cylindrical surface sections has a curvature for totally reflecting light emitted from the LEDs.

Preferably, the LEDs may be at least a pair of LEDs for respectively emitting complementary colored rays.

Preferably, the LEDs may be arranged in a line just below an intersection line where the two cylindrical surface sections meet.

Preferably, the molding portion may be made of a transparent epoxy having a refractivity higher than that of air.

Preferably, the upper surface of the substrate may be coated with a material, which does not absorb light, and a plurality of light scattering means may be protruded from the upper surface of the substrate. More preferably, the light scattering means may have dot or strip shapes, and the light scattering means may be aligned such that the intervals between the light scattering means distant from the light source are narrower than the intervals between the light scattering means close to the light source.

In accordance with a further aspect of the present invention, there is provided a backlight assembly for an LCD, attached to a rear surface of an LCD panel, the backlight assembly comprising: a light source manufactured by connecting a plurality of the above LED packages in a direction perpendicular to the arrangement line of one LED or more; a light guide plate, installed at one side of the light source, for causing light generated from the light source to be uniformly incident on the LCD panel; a diffusion sheet, provided on one surface of the light guide plate toward the LCD panel, for uniformly diffusing the light incident from the light guide plate; and at least one convergence sheet, provided on one surface of the diffusion sheet toward the LCD panel, for converging the light diffused by the diffusion sheet in a direction perpendicular to the plane of the LCD panel.

In case that the length and the width of the light source are nearly the same, the light source is used as a surface light source for irradiating light directly onto the rear surface of the LCD panel. In this case, the backlight assembly comprises: a light source manufactured by connecting a plurality of the above LED packages in a direction perpendicular to the arrangement line of one LED or more; a diffusion sheet, provided on one surface of the light source toward the LCD panel, for uniformly diffusing the light incident from the light source; and at least one convergence sheet, provided on one surface of the diffusion sheet toward the LCD panel, for converging the light diffused by the diffusion sheet in a direction perpendicular to the plane of the LCD panel.

BRIEF DESCRIPTION OF THE DRAWINGS

The above and other objects, features and other advantages of the present invention will be more clearly understood from the following detailed description taken in conjunction with the accompanying drawings, in which:

FIG. 2b is a top view of the LED package shown in FIG. 2a;

FIG. 2c is a front view of the LED package shown in FIG. 2a;

FIG. 3a is a perspective view of a light source comprising the LED package shown in FIG. 2a;

FIG. 3b is a top view of the light source comprising the LD package shown in FIG. 2a;

FIGS. 4a and 4b are schematic views illustrating an optical route of the light source comprising the LED package shown in FIG. 2a;

FIG. 5b is a top view of the LED package shown in FIG. 5a;

FIG. 5c is a front view of the LED package shown in FIG. 5a;

FIG. 6 is a perspective view of a light source comprising the LED package shown in FIG. 5a;

FIG. 7 is an exploded perspective view of a backlight assembly for an LCD comprising the light source shown in FIG. 3a.

DESCRIPTION OF THE PREFERRED EMBODIMENTS

Now, preferred embodiments of the present invention will be described in detail with reference to the annexed drawings.

Figure 1:
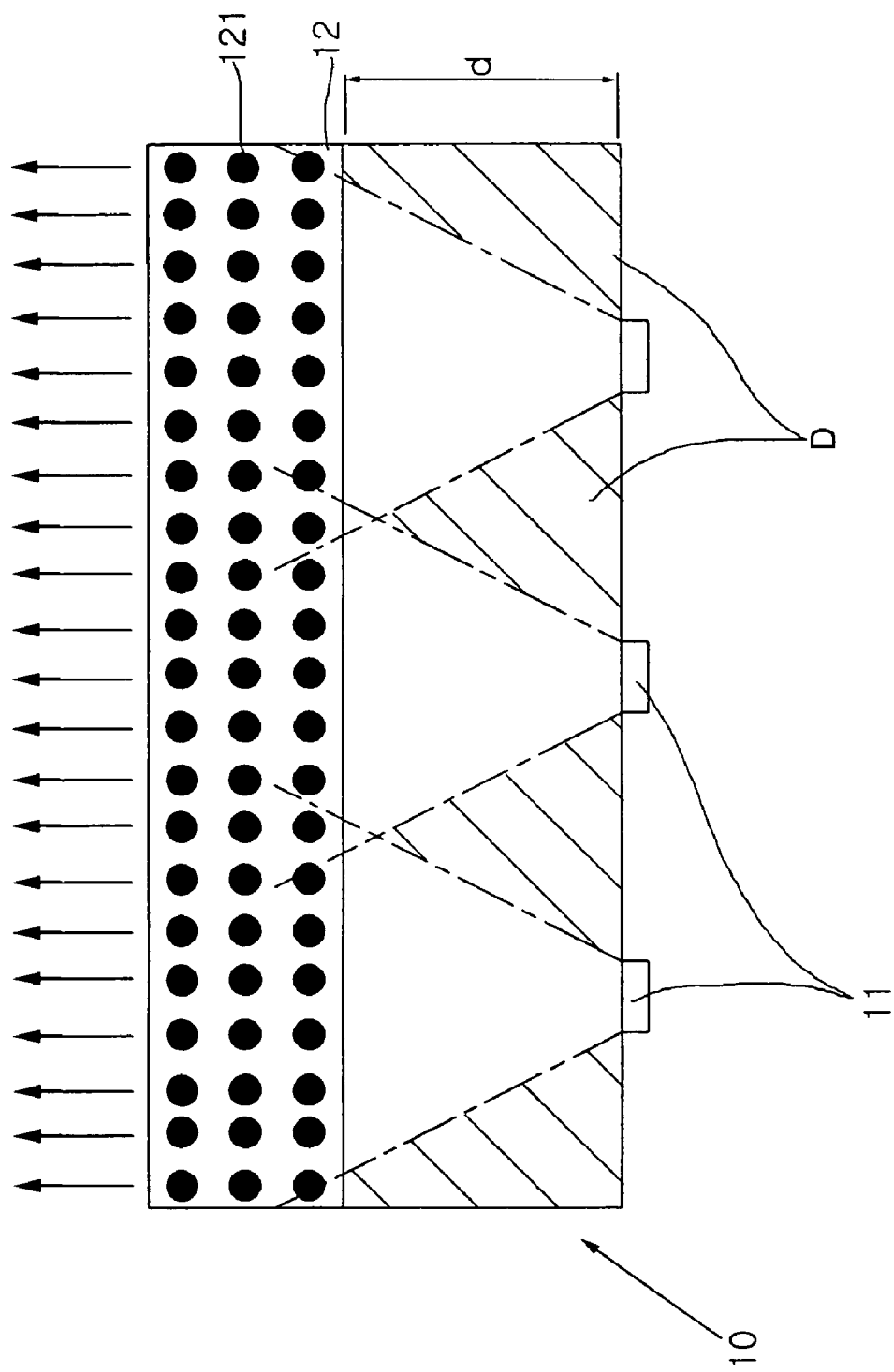
FIG. 1 is a schematic view of a conventional backlight source for an LCD using an LED.
Figure 2A:
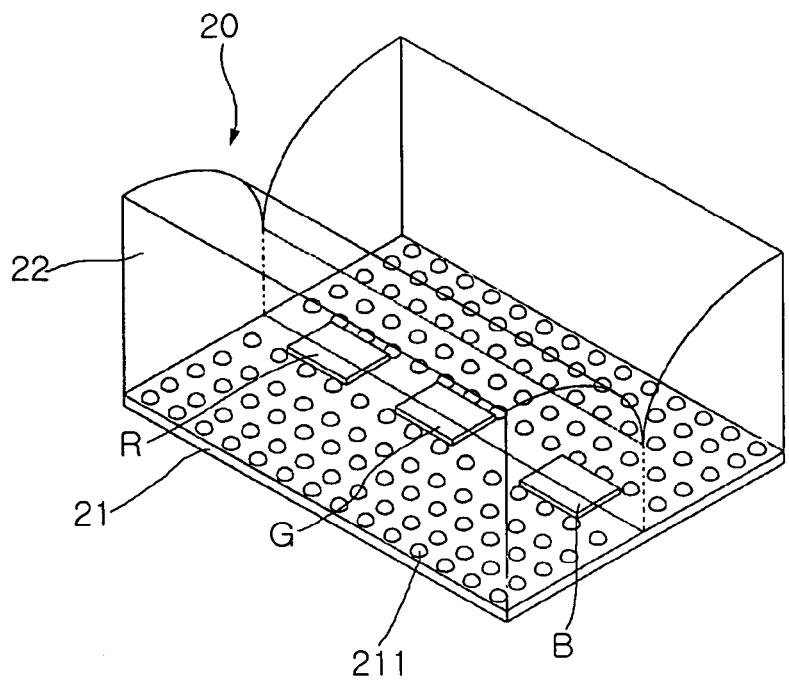
FIG. 2a is a perspective view of an LED package in accordance with one embodiment of the present invention.
Figure 2B:
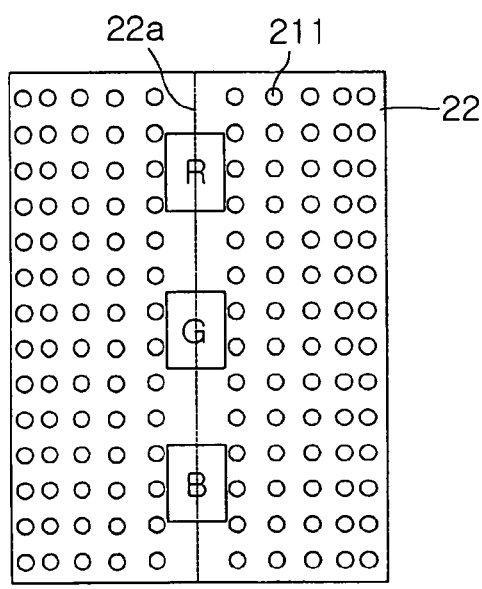
Figure 2C:
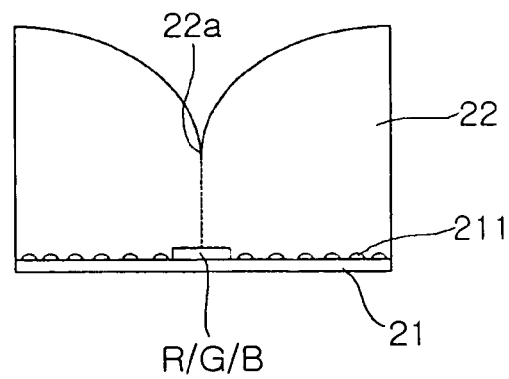

FIG. 2a is a perspective view of an LED package in accordance with a first embodiment of the present invention. FIG. 2b is a top view of the LED package in accordance with the first embodiment of the present invention. FIG. 2c is a front view of the LED package in accordance with the first embodiment of the present invention. With reference to FIGS. 2a to 2c, the LED package 20 in accordance with the first embodiment of the present invention comprises a substrate 21, LEDs (R, G, and B) separated from each other by designated intervals and arranged in a line on the substrate 21, and a molding portion 22, for sealing the upper surface of the substrate 21 including the LEDs (R, G, and B), provided with an upper surface including two cylindrical surface sections.

Although the LED package 20 in accordance with this embodiment of the present invention employs LEDs, respectively emitting three colored rays, i.e., red, green and blue rays, other type LEDs may be employed by LED packages. For example, since complementary colored rays are mixed to produce a white ray, at least one pair of LEDs for respectively emitting complementary colored rays may be employed by the LED package. Otherwise, at least one LED for emitting a white ray using luminescent material may be employed by the LED package. It would be appreciated by those skilled in the art that the number of the LEDs and colors of light emitted by the LEDs are not limited.

The substrate 21 may be a general insulating substrate made of ceramic, etc. The upper surface of the substrate 21 is coated with a material, which does not absorb light, and light scattering means 211 are protruded from the upper surface of the substrate 21.

Although the light scattering means 211 shown in FIGS. 2a to 2c are formed to have dot shapes, the light scattering means 211 may be formed to have strip shapes in parallel with the arrangement line of the LEDs (R, G, and B). Preferably, the light scattering means 211 are aligned such that the intervals between the light scattering means 211 distant from the LEDs (R, G, and B) are narrower than the intervals between the light scattering means 211 close to the LEDs (R, G, and B). The uniformity of the light emitted from the LEDs (R, G, and B) is properly adjusted by the shape and arrangement of the light scattering means 211.

The LEDs (R, G, and B) include a red LED (R), a green LED (G) and a blue LED (B), and are preferably separated from each other by designated intervals and arranged in a line.

The molding portion 22 seals the upper surface of the substrate 21 including the LEDs (R, G, and B), and the upper surface of the molding portion 22 has two cylindrical surface sections. The two cylindrical surface sections serve to totally reflect light emitted from the LEDs (R, G, and B) without refraction. The two cylindrical surface sections meet at an intersection line 22a, and, as shown in FIG. 2b, the LEDs (R, G, and B) are arranged in a line just below the intersection line 22a. The above arrangement of the LEDs (R, G, and B) is more apparently illustrated in FIG. 2c.

The molding portion 22 is made of a transparent epoxy having a refractivity higher than that of air. In case that light is incident from a medium having an optically high density (i.e., a material having a high refractivity) on a medium having an optically low density (i.e., a material having a low refractivity), when an incident angle is more than a designated angle (critical angle), the light is totally reflected by an interface therebetween, thereby being incapable of producing refracted light. This is referred to as "total reflection", and the minimum value of the incident angle for achieving the total reflection is referred to as "critical angle". In order to totally reflect the light emitted from the LEDs (R, G, and B) at the upper surface of the molding portion 22, the refractivity of the molding portion 22 must be higher than that of air outside the molding portion 22.

Each of the cylindrical surface sections of the molding portion 22 has a curvature for totally reflecting the light emitted from the LEDs (R, G, and B). That is, the curvatures of the cylindrical surface sections of the molding portion 22 are determined such that the incident angle of the light emitted from the LEDs (R, G, and B) on the upper surface of the molding portion 22 is higher than the critical angle, thereby allowing the light emitted from the LEDs (R, G, and B) not to be emitted to the outside of the molding portion 22 and to be reflected again into the inside of the molding portion 22. Thus, the total reflection lengthens the optical traveling route, and allows colored rays to be uniformly mixed. Further, the light emitted from the LEDs (R, G, and B) is not concentrated into a central area and is uniformly directed toward the overall upper surface of the molding portion 22.

A line light source used in a backlight assembly for an LCD having designated width and length is manufactured by connecting a plurality of the LED packages 20 in accordance with the above embodiment of the present invention in a direction perpendicular to the arrangement line of the LEDs (R, G, and B). In this case, the LED packages 20 are used as cells constituting the line light source.

Figure 3A:
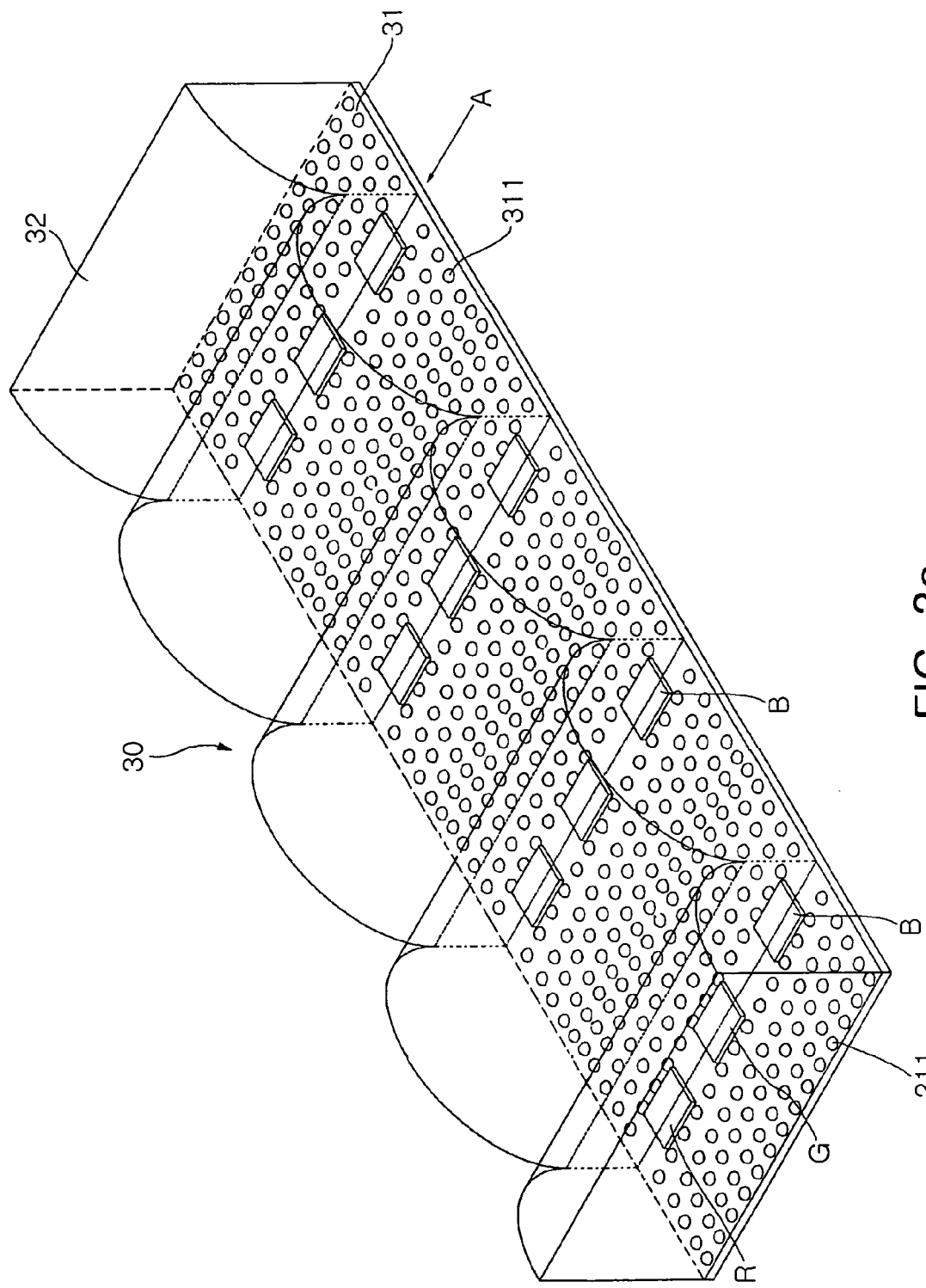
Figure 3B:
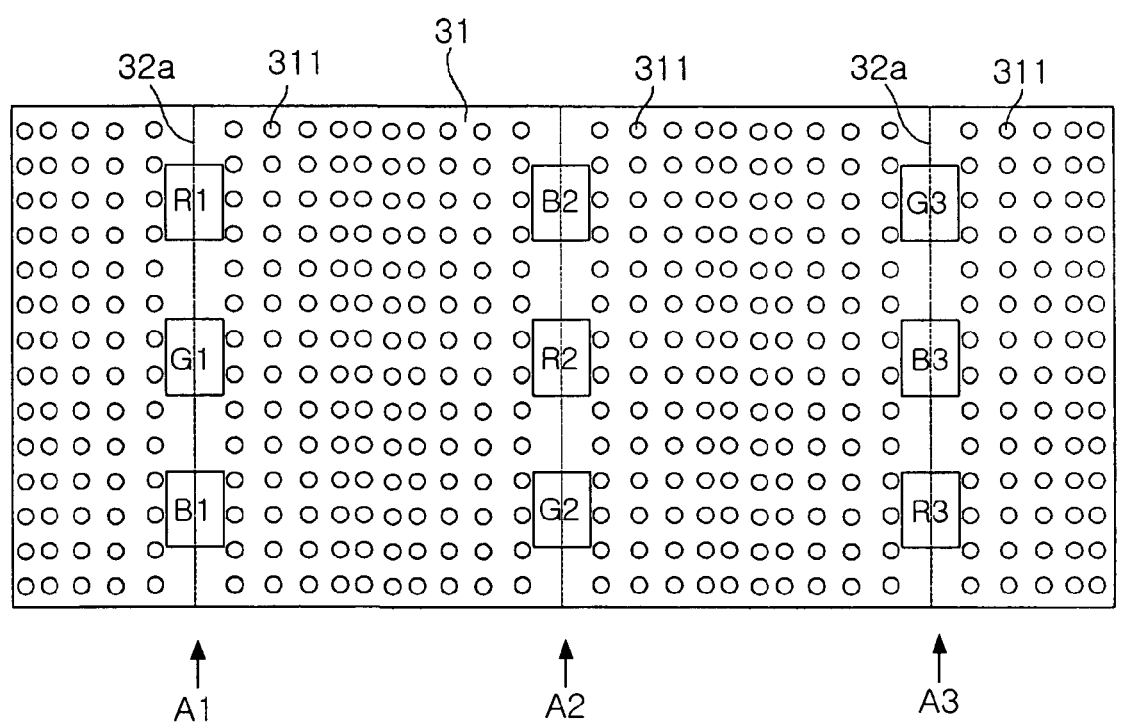

As shown in FIGS. 3a and 3b, a light source obtained by connecting a plurality of the LED packages 20, serving as cells, in accordance with the above embodiment comprises a substrate 31, a plurality of LED arrays (A) separated from each other by designated intervals, each LED array including red, green and blue LEDs (R, G and B), and a molding portion 32, for sealing the upper surface of the substrate 31 including the LED arrays (A), provided with an upper surface including a plurality of cylindrical surface sections disposed perpendicularly to the arrangement line of the LEDs (R, G, and B).

In order to use the above-described light source as a line light source, the length of the light source in the direction of the arrangement line of the LEDs (R, G, and B), i.e., the transverse direction, is comparatively short, and the length of the light source in the direction perpendicular to the arrangement line of the LEDs (R, G, and B), i.e., the longitudinal direction, is comparatively long. The above line light source is used as a light source of a backlight assembly for an LCD using a side light source.

The light source comprising the LED packages is not limited to the line light source. In case that the transverse and longitudinal lengths of the light source are approximately the same, the light source may be used as a surface light source. The surface light source employing the LED packages in accordance with this embodiment may be used as a light source of a backlight assembly for an LCD, which directly irradiates light to an LCD panel.

An example of the light source comprising the LED packages in accordance with this embodiment, which is used as a light source of a backlight assembly for an LCD, will be described in detail later.

As described above, the light generated from the LEDs (R, G, and B) is totally reflected by the interface between external air and the molding portion 32 made of epoxy and provided with the upper surface including a plurality of the cylindrical surface sections, and is directed again to the inside of the molding portion 32. The reflected light is reflected again by light scattering means 311 disposed on the upper surface of the substrate 31 so that a part of the light is emitted to the outside of the molding portion 32 and the other part of the light is reflected to the inside of the molding portion 32. That is, the light generated from the LEDs (R, G, and B) has an extended optical route in the molding portion 32 in the longitudinal direction, thereby allowing colors of rays to be uniformly mixed, and preventing the light from being concentrated on the upper surfaces of the LEDs (R, G, and B) so that light having uniform luminance is emitted to the overall upper surface of the molding portion 32.

Now, with reference to FIGS. 4a and 4b, a function of the above-described light source of the present invention will be described in detail.

With reference to FIG. 4a, light (L1) emitted from an LED1 does not pass through the upper surface of a molding portion 42, and is totally reflected by the molding portion 42. Since the incident angle of the light (L1) onto a point of one of the cylindrical surface sections of the molding portion 42 is larger than a critical angle, the light (L1) is totally reflected by the cylindrical surface section of the molding portion 42. Accordingly, the cylindrical surface section of the molding portion 42 must have a curvature capable of totally reflecting light emitted from the LEDs. The light (L1) emitted from the LED1 is first totally reflected by the upper surface of the molding portion 42, is secondarily totally reflected by the upper surface of the molding portion 42, collides with light scattering means 411, and is then emitted upwardly. In the same manner, light (L2) emitted from an LED2 is totally reflected three times by the upper surface of the molding portion 42, collides with the light scattering means 411 formed on the substrate 41, and is then emitted upwardly.

As described above, the light emitted from the LEDs is not directly emitted upwardly, but is reflected several times by the molding portion 42, thereby having an extended optical traveling route. In case that LEDs, respectively emitting three colored rays, i.e., red, green and blue rays, are used, the extended optical traveling route facilitates the mixing of the red, green and blue rays, and disperses the light, thereby eliminating the generation of dark regions and allowing light having uniform luminance to be emitted from the overall area of the line light source. Since the above line light source emits the white ray having the uniform luminance, the line light source is used as a light source of a backlight assembly for an LCD.

FIG. 4b is a schematic view illustrating in detail the total reflection of light by the molding portion 42. As shown in FIG. 4b, light (L3) emitted from an LED3 is incident onto a point (P) of the molding portion 42. Here, in case that the incident angle (θ) between the normal line of the slope of the cylindrical surface section at the point (P) and the incident light (L3) is larger than the critical angle, the light (L3) is totally reflected by the cylindrical surface section of the molding portion 42. Accordingly, the curvature of cylindrical surface section of the molding portion 42 is suitably determined in consideration of the refractivity of a transparent epoxy used as a material of the molding portion 42 and the critical angle thereof.

Figure 5A:
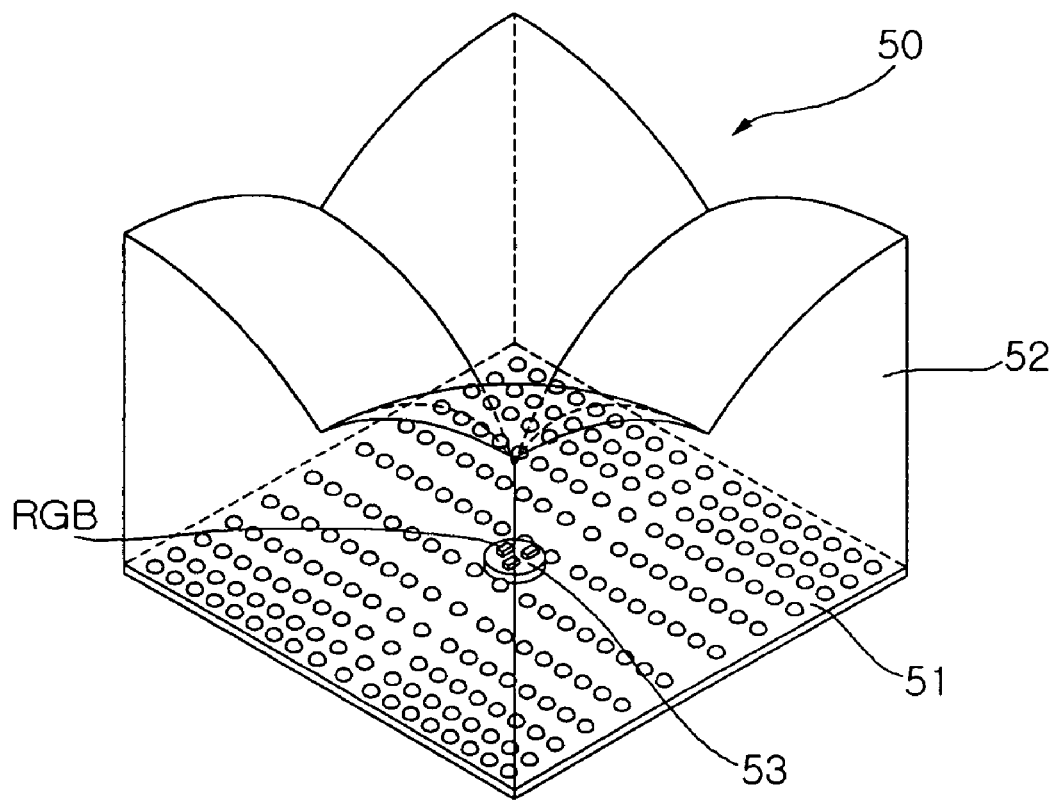
FIG. 5a is a perspective view of an LED package in accordance with another embodiment of the present invention.
Figure 5B:
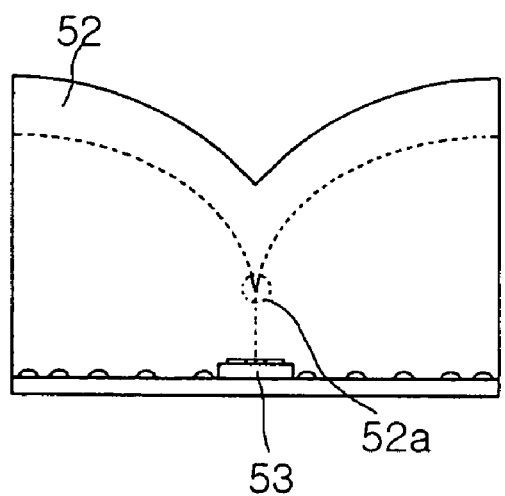
Figure 5C:
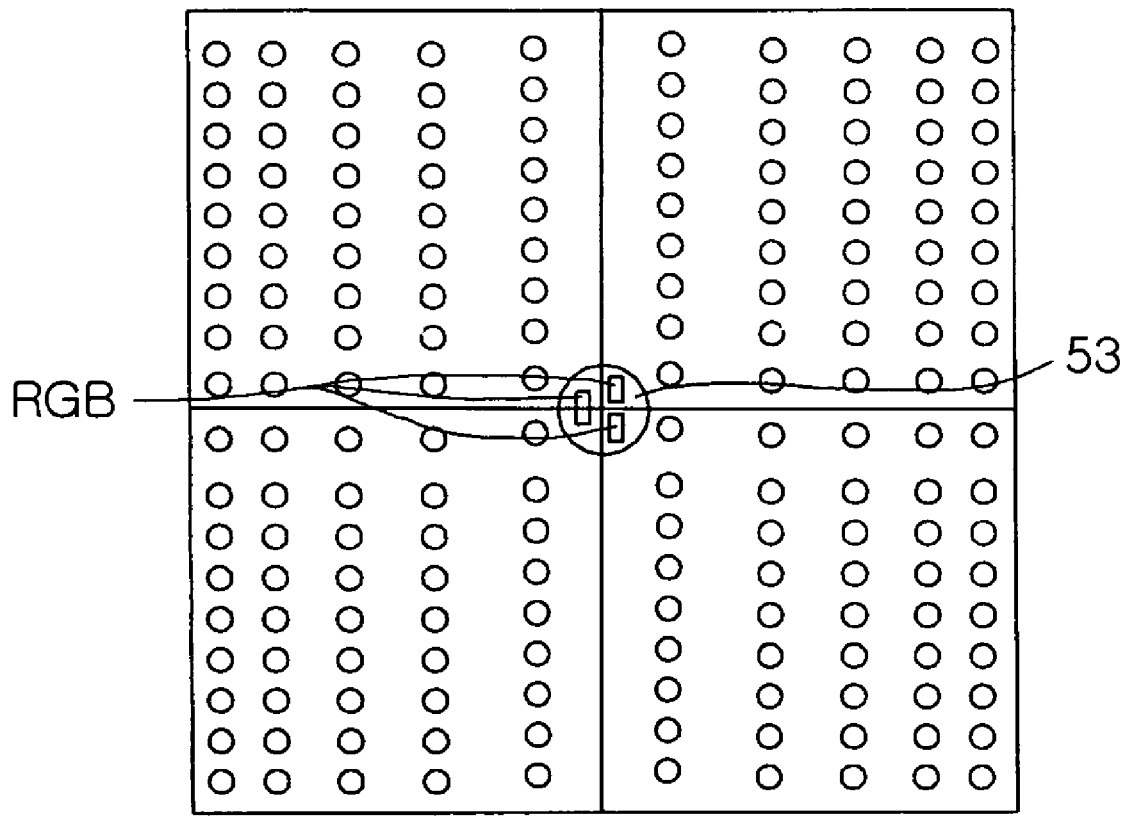

FIG. 5a is a perspective view of an LED package in accordance with a second embodiment of the present invention. FIG. 5b is a top view of the LED package in accordance with the second embodiment of the present invention. FIG. 5c is a front view of the LED package in accordance with the second embodiment of the present invention. With reference to FIGS. 5a to 5c, the LED package 50 in accordance with the second embodiment of the present invention comprises a substrate 51, an LED group (RGB) including red, green and blue LEDs and placed at a point on the substrate 51, and a molding portion 52, for sealing the upper surface of the substrate 51 including the LED group (RGB), provided with an upper surface including four curved surfaces meeting at one intersection point 52a. The LED package 50 in accordance with this embodiment further comprises a cup 53 placed on the upper surface of the substrate 51 for receiving the LED group (RGB).

Although the LED package 50 in accordance with this embodiment of the present invention employs the LED group including three LEDs respectively emitting three colored rays, i.e., red, green and blue rays, other type LEDs may be employed by LED packages to generate a white ray. For example, since complementary colored rays are mixed to produce a white ray, at least one pair of LEDs for respectively emitting complementary colored rays may be employed by the LED package. Otherwise, at least one LED for emitting a white ray using luminescent material may be employed by the LED package. It would be appreciated by those skilled in the art that the number of the LEDs and colors of light emitted from the LEDs are not limited.

In this embodiment, the substrate 51 may be a general insulating substrate made of ceramic, etc. The upper surface of the substrate 51 is coated with a material, which does not absorb light, and light scattering means 511 are protruded from the upper surface of the substrate 51.

Although the light scattering means 511 shown in FIGS. 5a to 5c are formed to have dot shapes, the light scattering means 511 may be formed to have concentrically circular shapes centering on the LED group (RGB) or the cup 53. Preferably, the light scattering means 511 are aligned such that the intervals between the light scattering means 511 distant from the LED group (RGB) or the cup 53 are narrower than the intervals between the light scattering means 511 close to the LED group (RGB) or the cup 53. The uniformity of the light emitted from the LEDs of the LED group (RGB) is properly adjusted by the shape and arrangement of the light scattering means 511.

The LED group (RGB) includes a red LED, a green LED and a blue LED so as to generate a white ray, and is placed on the cup 53. Preferably, the inner surface of the cup 53 is coated with a material having a high reflectivity so that light emitted from side or lower surface of the LEDs is partially reflected by the inner surface of the cup 53.

The molding portion 52 seals the upper surface of the substrate 51 including the LED group (RGB) or the cup 53, and the upper surface of the molding portion 52 includes four curved surfaces meeting at the intersection point 52a. The four curved surfaces serve to totally reflect light emitted from the LED group (RGB) without refraction. The four curved surfaces meet at the intersection point 52a, and, as shown in FIG. 5b, the LED group (RGB) is arranged just below the intersection point 52a. The above arrangement of the LED group (RGB) is more clearly illustrated in FIG. 5c.

The molding portion 52 is made of a transparent epoxy having a refractivity higher than that of air. In order to totally reflect the light emitted from the LED group (RGB) at the upper surface of the molding portion 52, the refractivity of the molding portion 52 must be higher than that of air outside the molding portion 52.

Each of the curved surfaces of the molding portion 52 has a curvature capable of totally reflecting the light emitted from the LED group (RGB). That is, the curvatures of the curved surfaces of the molding portion 52 are determined such that the incident angle of the light emitted from the LED group (RGB) onto the upper surface of the molding portion 52 is higher than the critical angle, thereby allowing the light emitted from the LED group (RGB) not to be emitted to the outside and to be reflected again to the inside of the molding portion 52. Thus, the total reflection lengthens the optical traveling route, and allows various colored rays to be uniformly mixed. Further, the light emitted from the LED group (RGB) is not concentrated on the upper surface of the LED group (RGB) and is uniformly directed toward the overall upper surface of the molding portion 52.

A light source used in a backlight assembly for an LCD is manufactured by connecting a plurality of the LED packages 50 in longitudinal and transverse directions in accordance with the above embodiment of the present invention. In case that a bar-shaped light source is manufactured by connecting the LED packages 50 in accordance with this embodiment, the manufactured light source is used as a line light source used by a backlight unit for an LCD, which is a side light source. In case that a plate-shaped light source is manufactured by connecting the LED packages 50 in accordance with this embodiment, the manufactured light source is used as a surface light source, which directly irradiates light to a rear surface of an LCD panel. In these cases, the LED packages 50 are used as cells constituting the light source.

Figure 6:
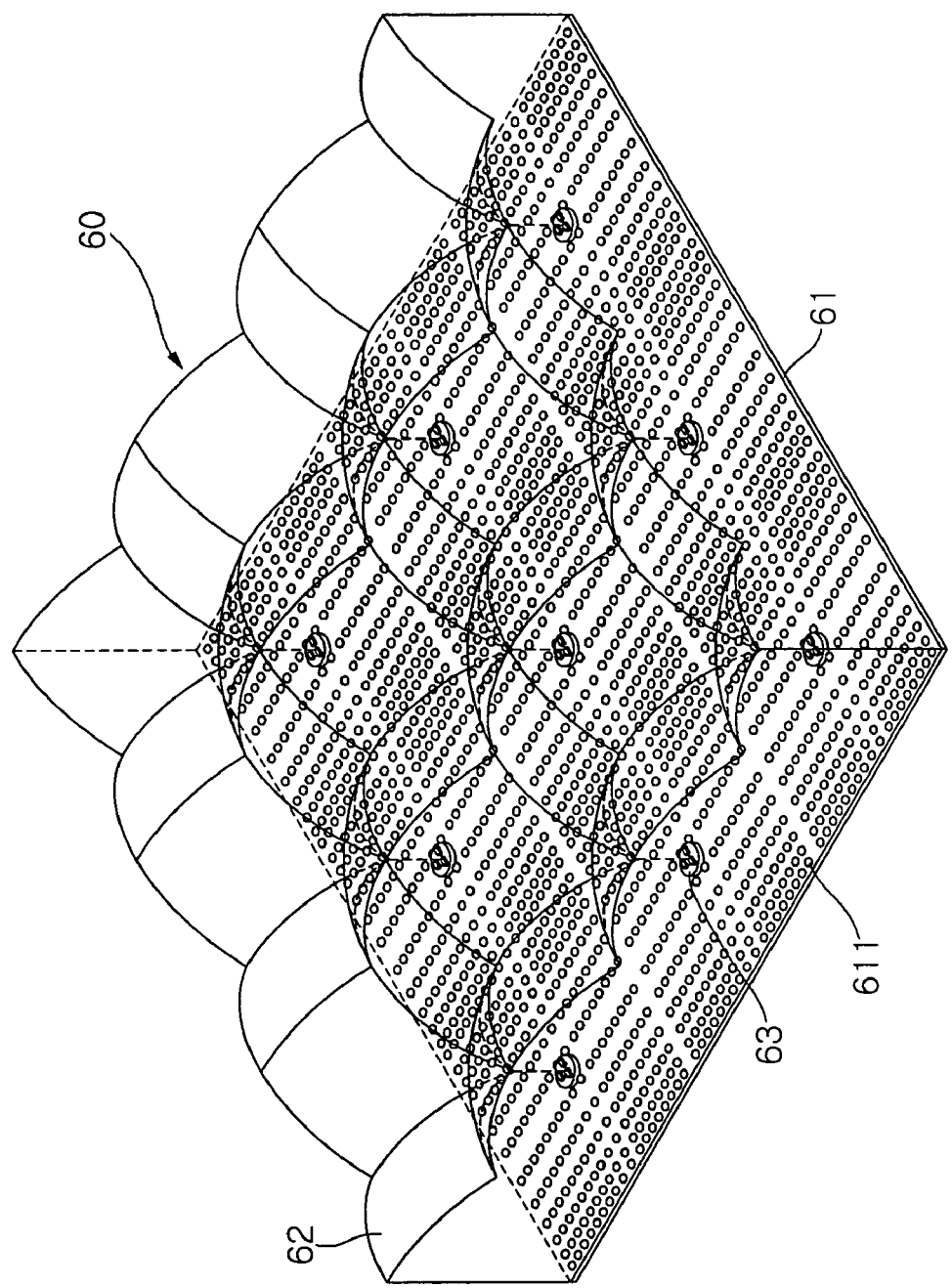

As shown in FIG. 6, a light source obtained by connecting a plurality of the LED packages 50, serving as cells, in longitudinal and transverse directions in accordance with the above embodiment comprises a substrate 61, a plurality of LED groups, each LED group including red, green and blue LEDs disposed on the upper surface of the substrate 61 in longitudinal and transverse directions so that the red, green and blue LEDs are separated from each other by designated intervals, a molding portion 62, for sealing the upper surface of the substrate 61 including the LED groups, provided with an upper surface including a plurality of curved surfaces disposed in longitudinal and transverse directions, and a cup 63 placed on the upper surface of the substrate 61 for receiving the LED groups.

The above-described light source, in the same manner as the principle and function as illustrated with reference to FIGS. 4a and 4b, has an extended optical route in the molding portion, thereby allowing the red, green and blue rays to be mixed into a white ray having uniform luminance. However, while the optical route of the light source comprising the LED packages in accordance with the first embodiment as shown in FIGS. 4a and 4b is extended to a direction perpendicular to the arrangement line of the LEDs, the optical route of the light source comprising the LED packages in accordance with the second embodiment is extended to all directions. Accordingly, it is preferable that the LED package in accordance with the first embodiment of the present invention as shown in FIG. 2a is applied to a line light source, and the LED package in accordance with the second embodiment of the present invention is applied to a surface light source.

Now, with reference to FIGS. 7 and 8, examples of light sources comprising LED packages in accordance with the above two embodiments of the present invention will be described in detail.

Figure 7:
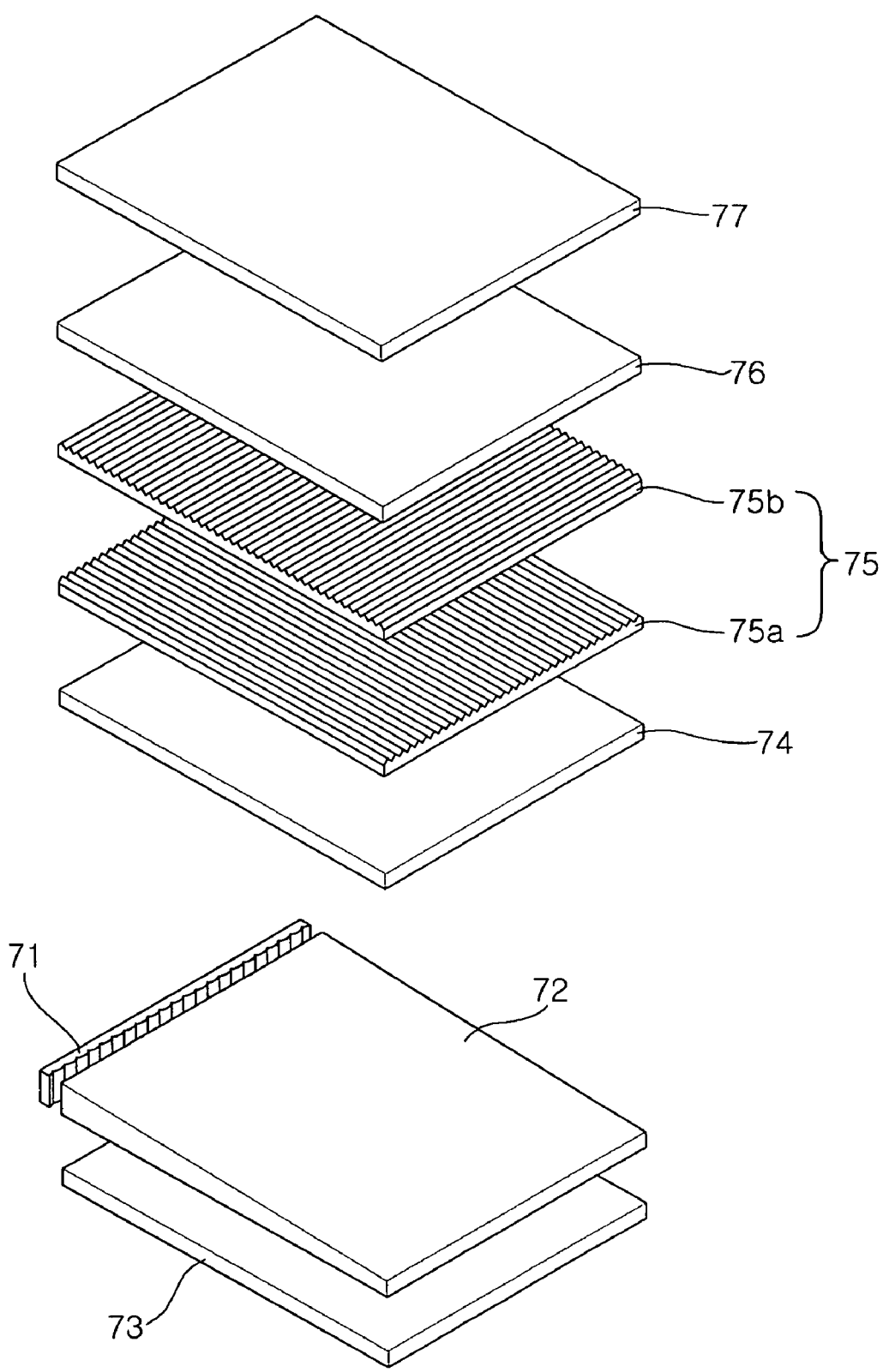

FIG. 7 is an exploded perspective view of a side light source-type backlight assembly for an LCD. With reference to FIG. 7, the backlight assembly comprises a light source 71 manufactured by connecting a plurality of LED packages in accordance with one embodiment of the present invention in longitudinal and/or transverse directions, a light guide plate 72, installed at one side of the light source 71, for causing light generated from the light source 71 to be uniformly incident on an LCD panel 77, a diffusion sheet 74, provided on one surface of the light guide plate 72 toward the LCD panel 77, for uniformly diffusing the light incident from the light guide plate 72, and at least one convergence sheet 75, provided on one surface of the diffusion sheet 74 toward the LCD panel 77, for converging the light diffused by the diffusion sheet 74 in a direction perpendicular to the plane of the LCD panel 77.

Although the light source 71 shown in FIG. 7 is a bar-shaped line light source obtained by connecting the LED packages in accordance with the first embodiment of the present invention in a direction perpendicular to the arrangement line of the LEDs, it would be appreciated by those skilled in the art that a bar-shaped line light source obtained by connecting the LED packages in accordance with the second embodiment of the present invention is used as the light source 71.

A backlight assembly using a conventional cold-cathode lamp requires reflecting means surrounding the cold-cathode lamp for reflecting light, emitted to a side opposite to the light guide plate, toward the light guide plate. However, since the upper surface of the substrate of the light source of the present invention is coated with a reflective material, the light source of the present invention emits light having a sufficient density toward the light guide plate without using any reflecting means, thus not requiring the reflecting means. Accordingly, the light source using the LED packages of the present invention is advantageous in terms of lightweight and slim trends of the LCD.

Further, the above-described light source using the LED packages of the present invention assures a sufficient optical route therein, thus having uniformity in color and optical intensity of light approximately the same as those of the conventional cold-cathode lamp.

The light guide plate 72 is made of a transparent plastic material, such as acryl, such that the light guide plate 72 has an inclined lower surface and a level upper surface (or an inclined upper surface and a level lower surface). The light generated from the light source 71 passes through the upper surface of the light guide plate 72, and is directed toward the LCD panel 77 above the light guide plate 72. Accordingly, various patterns, such as a finely dotted pattern, for changing the traveling direction of the light generated from the light source 71 are printed on the lower surface of the light guide plate 72.

A reflection plate 73 is placed on the lower surface of the light guide plate 72. The reflection plate 73 reflects a part of the light traveling toward the lower surface of the light guide plate 72, which is not reflected by the finely dotted pattern, to the upper surface of the light guide plate 72, thereby reducing loss of the light incident on the LCD panel 77 and improving uniformity of the light transmitted toward the upper surface of the light panel 72. As described above, the light guide plate 72 and the reflection plate 73 guide the light generated from the light source 71 toward the upper surface of the light guide plate 72.

The light having passed through the upper surface of the light guide plate 72 includes rays inclined against the upper surface of the light guide plate 72 at various angles as well as rays perpendicular to the upper surface of the light guide plate 72. The diffusion sheet 74 placed on the upper surface of the light guide plate 72 serves to diffuse the light incident from the light guide plate 72, thereby preventing the light from being partially concentrated. The convergence sheet 75 includes a first convergence sheet 75a and a second convergence sheet 75b. Further, the diffusion sheet 74 serves to reduce the incident angle of the light traveling on the first convergence sheet 75a.

Each of the first convergence sheet 75a and the second convergence sheet 75b includes a plurality of triangular prisms uniformly arranged on an upper surface thereof. The arrangement of the prisms of the first convergence sheet 75a and the arrangement of the prisms of the second convergence sheet 75b cross each other at a designated angle. The first and second convergence sheets 75a and 75b serve to converge the light, which has been diffused by the diffusion sheet 74, into the LCD panel 77 in a direction perpendicular to the plane of the LCD panel 77, thereby allowing the light having passed through the first and second convergence sheets 75a and 75b to be vertically incident on a protective sheet 76. Thus, since the light having passed through the first and second convergence sheets 75a and 75b travels nearly vertically, the distribution of luminance on the protective sheet 76 is uniform. Although the light source of FIG. 7 employs two convergence sheets, the light source may employ a single convergence sheet when occasion demands.

The protective sheet 76 placed on the upper surface of the second convergence sheet 75b serves to diffuse the light for making the distribution of the light uniform, as well as to protect the surface of the second convergence sheet 75b. The LCD panel 77 is placed on the protective sheet 76.

Figure 8:
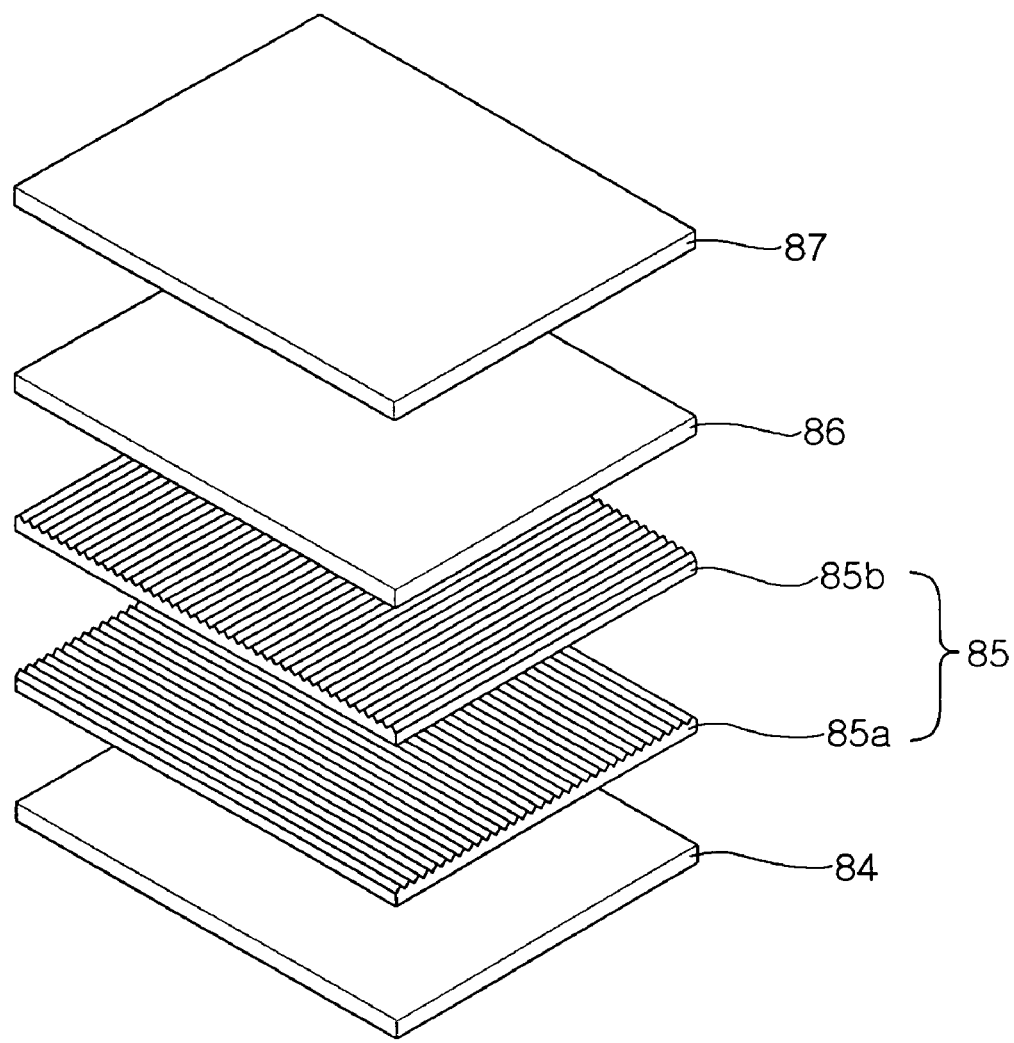
FIG. 8 is an exploded perspective view of a backlight assembly for an LCD comprising the light source shown in FIG. 6.
Figure 8:
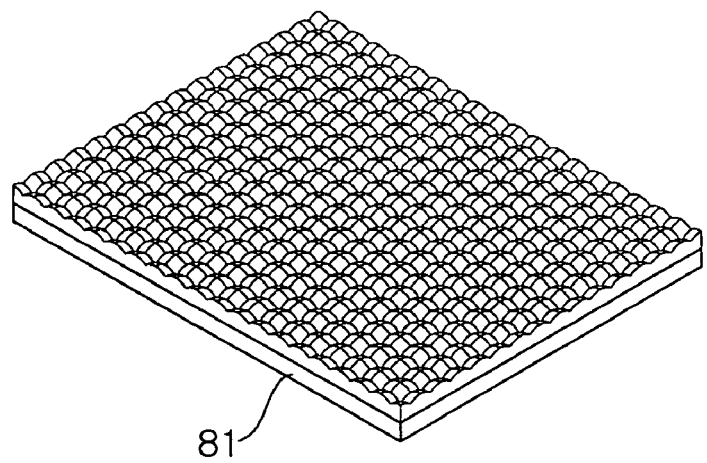

FIG. 8 is an exploded perspective view of a surface light source-type backlight assembly for an LCD, which irradiates light directly to a rear surface of an LCD panel. With reference to FIG. 8, the backlight assembly comprises a light source 81 manufactured by connecting a plurality of LED packages in accordance with one embodiment of the present invention in longitudinal and/or transverse directions, a diffusion sheet 84, provided on one surface of the light source 81 toward an LCD panel 87, for uniformly diffusing the light incident from the light source 81, and at least one convergence sheet 85, provided on one surface of the diffusion sheet 84 toward the LCD panel 87, for converging the light diffused by the diffusion sheet 84 in a direction perpendicular to the plane of the LCD panel 87.

Although the light source 81 shown in FIG. 8 is a plate-shaped surface light source obtained by connecting the LED packages in accordance with the second embodiment of the present invention in longitudinal and transverse directions, it would be appreciated by those skilled in the art that a plate-shaped surface light source having nearly the same longitudinal and transverse lengths obtained by connecting the LED packages in accordance with the first embodiment of the present invention is used as the light source 81.

As shown in FIG. 8, a surface light source, for irradiating light directly onto the rear surface of the LCD panel 87, must emit light of uniform luminance and color throughout the overall surface thereof. The light source comprising the LED packages of the present invention assures a sufficient optical route in the packages, thus uniformly mixing colors of rays and reducing the concentration of optical intensity of light. Accordingly, the light source comprising the LED packages of the present invention serves as a surface light source for irradiating light directly onto the rear surface of the LCD panel. Particularly, the LED package in accordance with the second embodiment of the present invention has an extended optical route of light emitted from the LEDs in all directions. Thus, preferably, a plate-shaped surface light source comprises a plurality of the LED packages in accordance with the second embodiment of the present invention, which are connected in longitudinal and transverse directions.

Particularly, in the example as shown in FIG. 8, since the light source 81 irradiates light onto the overall rear surface of the LCD panel 87 and the sufficient optical route in the light source 81 is assured, the backlight assembly obtains uniformity in color and intensity of light, thus not requiring a light guide plate and a reflection plate placed on the lower surface of the light guide plate. Accordingly, the light source comprising the LED packages of the present invention sufficiently satisfies the lightweight and slim trends of the LCD.

The diffusion sheet 84, first and second convergence sheets 85a and 85b, and a protective sheet 86 are sequentially stacked on the upper surface of the light source 81. Here, functions and operations of the diffusion sheet 84, the first and second convergence sheets 85a and 85b and the protective sheet 86 are the same as those of the diffusion sheet 74, the first and second convergence sheets 75a and 75b and the protective sheet 76 shown in FIG. 7.

As described above, the LED package in accordance with the present invention is used as a cell constituting a bar-shaped line light source and a plate-shaped surface light source, and assures a sufficient optical traveling route therein, thereby achieving uniformity in color and intensity of light. Further, since the LED package is used as the cell, the number of the LED packages is adjusted based on the shape and size of the LCD. Thereby, it is possible to manufacture a light source by a simple process and to easily change the design of the light source if necessary.

As apparent from the above description, the present invention provides an LED package, which assures a sufficient optical traveling route therein, thereby generating a white ray having improved uniformity in luminance and color.

Further, the present invention provides a light source obtained by connecting a plurality of the LED packages serving as cells. Thereby, it is possible to produce a light source of a backlight assembly for an LCD without using a plurality of LEDs. Further, the light source is simply produced by adjusting the number of the LED packages based on the shape and size of the LCD, and the design of the light source is easily changed if necessary.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An LED package, comprising:
   a substrate;
   a plurality of light scattering means protruding from the upper surface of the substrate;
   LEDs separated from each other by designated intervals and arranged in a line on the substrate; and
   a molding portion sealing the upper surface of the substrate including the LEDs, said molding portion having an upper surface including two cylindrical surface sections;
   wherein each of the cylindrical surface sections has a curvature configured for totally reflecting light emitted from the LEDs.

2. The LED package as set forth in claim 1,
   wherein the LEDs are at least a pair of LEDs for respectively emitting complementary colored rays.

3. The LED package as set forth in claim 1,
   wherein the line along which the LEDs are arranged is located just below an intersection line where the two cylindrical surface sections meet.

4. The LED package as set forth in claim 1,
   wherein the molding portion is made of a transparent epoxy having a refractivity higher than that of air.

5. The LED package as set forth in claim 1,
   wherein the upper surface of the substrate is coated with a material, which does not absorb light.

6. The LED package as set forth in claim 1,
   wherein the light scattering means have dot or strip shapes.

7. The LED package as set forth in claim 1,
   wherein the light scattering means are aligned such that the intervals between the light scattering means distant from the line of the LEDs are narrower than the intervals between the light scattering means close to the line of the LEDs.

8. The LED package as set forth in claim 1,
   wherein the LEDs include at least a red light emitting LED, at least a green light emitting LED, and at least a blue light emitting LED.

9. A light source comprising a plurality of connected LED packages, each as being set forth in claim 1.

10. A backlight assembly adapted to be attached to a rear surface of an LCD panel, said backlight assembly comprising:
    a light source comprising a plurality of connected LED packages, each as being set forth in claim 1;
    a light guide plate, installed at one side of the light source, for guiding light generated from the light source toward the LCD panel;
    a diffusion sheet, provided on one surface of the light guide plate that is adapted to face toward the LCD panel, for uniformly diffusing the light incident from the light guide plate; and
    at least one convergence sheet, provided on one surface of the diffusion sheet that is adapted to face toward the LCD panel, for converging the light diffused by the diffusion sheet in a direction perpendicular to the plane of the LCD panel.

11. A backlight assembly adapted to be attached to a rear surface of an LCD panel, said backlight assembly comprising:
    a light source comprising a plurality of connected LED packages, each as being set forth in claim 1;
    a diffusion sheet, provided on one surface of the light source that is adapted to face toward the LCD panel, for uniformly diffusing the light incident from the light source; and
    at least one convergence sheet, provided on one surface of the diffusion sheet that is adapted to face toward the LCD panel, for converging the light diffused by the diffusion sheet in a direction perpendicular to the plane of the LCD panel.

12. An LED package, comprising:
    a substrate;
    a plurality of light scattering protrusions on the upper surface of the substrate;
    LEDs separated from each other by designated intervals and arranged in a line on the substrate; and
    a molding portion sealing the upper surface of the substrate including the LEDs, said molding portion having an upper surface including two cylindrical surface sections;
    wherein each of the cylindrical surface sections has a curvature configured for totally reflecting light emitted from the LEDs.

13. The LED package as set forth in claim 12,
    wherein the LEDs are at least a pair of LEDs for respectively emitting complementary colored rays.

14. The LED package as set forth in claim 12,
    wherein the line along which the LEDs are arranged is located just below an intersection line where the two cylindrical surface sections meet.

15. The LED package as set forth in claim 12,
wherein the molding portion is made of a transparent epoxy having a refractivity higher than that of air.

16. The LED package as set forth in claim 12,
wherein the upper surface of the substrate is coated with a material, which does not absorb light.

17. The LED package as set forth in claim 12,
wherein the light scattering protrusions comprise dots or strips.

18. The LED package as set forth in claim 12,
wherein the light scattering protrusions are aligned such that the intervals between the light scattering protrusions farther from the line of the LEDs are narrower than the intervals between the light scattering protrusions closer to the line of the LEDs.

19. A backlight assembly adapted to be attached to a rear surface of an LCD panel, said backlight assembly comprising:
   a light source comprising a plurality of LED packages, each as being set forth in claim 12;
   a light guide plate, installed at one side of the light source, for guiding light generated from the light source toward the LCD panel;
   a diffusion sheet, provided on one surface of the light guide plate that is adapted to face toward the LCD panel, for uniformly diffusing the light incident from the light guide plate; and
   at least one convergence sheet, provided on one surface of the diffusion sheet that is adapted to face toward the LCD panel, for converging the light diffused by the diffusion sheet in a direction perpendicular to the plane of the LCD panel.

20. A backlight assembly adapted to be attached to a rear surface of an LCD panel, said backlight assembly comprising:
   a light source comprising a plurality of LED packages, each as being set forth in claim 12,
   a diffusion sheet, provided on one surface of the light source that is adapted to face toward the LCD panel, for uniformly diffusing the light incident from the light source; and
   at least one convergence sheet, provided on one surface of the diffusion sheet that is adapted to face toward the LCD panel, for converging the light diffused by the diffusion sheet in a direction perpendicular to the plane of the LCD panel.

* * * * *